(12) United States Patent
Roesner et al.

(10) Patent No.: US 9,449,876 B2
(45) Date of Patent: Sep. 20, 2016

(54) SINGULATION OF SEMICONDUCTOR DIES WITH CONTACT METALLIZATION BY ELECTRICAL DISCHARGE MACHINING

(71) Applicant: Infineon Technologies AG, Neubiberg (DE)

(72) Inventors: Michael Roesner, Villach (AT); Gudrun Stranzl, Goedersdorf (AT); Manfred Schneegans, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/158,398

(22) Filed: Jan. 17, 2014

(65) Prior Publication Data

US 2015/0206802 A1 Jul. 23, 2015

(51) Int. Cl.
*H01L 21/00* (2006.01)
*H01L 21/78* (2006.01)
*H01L 21/66* (2006.01)
*H01L 23/00* (2006.01)
*B23H 1/00* (2006.01)
*B23H 9/00* (2006.01)

(52) U.S. Cl.
CPC .............. *H01L 21/78* (2013.01); *B23H 1/00* (2013.01); *B23H 9/00* (2013.01); *H01L 22/10* (2013.01); *H01L 23/564* (2013.01); *H01L 22/34* (2013.01); *H01L 2924/0002* (2013.01)

(58) Field of Classification Search
CPC .............. H01L 2224/73265; H01L 2234/97; H01L 21/02002
USPC ........................................ 438/107, 110, 113
See application file for complete search history.

(56) References Cited

U.S. PATENT DOCUMENTS

| | | | | |
|---|---|---|---|---|
| 6,180,435 B1 * | 1/2001 | Ise | ........................ | H01L 21/561 257/E21.504 |
| 2004/0058478 A1 * | 3/2004 | Islam | ..................... | H01L 21/561 438/123 |
| 2005/0186711 A1 * | 8/2005 | Yee | .................... | B29C 45/14418 438/123 |
| 2005/0263864 A1 * | 12/2005 | Islam | .................. | H01L 21/4832 257/676 |
| 2006/0001130 A1 * | 1/2006 | Islam | ..................... | H01L 21/561 257/666 |
| 2009/0275152 A1 * | 11/2009 | Rommeveaux | ....... | B81B 1/0023 438/25 |
| 2015/0115458 A1 * | 4/2015 | Palm | ....................... | H01L 24/09 257/774 |

FOREIGN PATENT DOCUMENTS

DE 102014104630 A1 10/2014

OTHER PUBLICATIONS

Kibria, G., et al., "Experimentation and Analysis into Micro-Hole Machining in EDM on Ti—Gal—4v Alloy Using Boron Carbide Powder Mixed De-Ionized Water." International Journal of Materials, Manufacturing and Design, 2012, pp. 17-35, vol. 1, No. 1, Academic Research Journals.
Campana, S., et al. "Micro-EDM and ECM in DI water." Proceedings of Annual Meeting of American Society of Precision Engineering (ASPE), 1999, pp. 1-4.
Gatzen, H.H., et al., "Electroplated Cu Micro Electrode for Application in Micro Electrostatic Discharge Machining (EDM)." 214th Electrochemical Society Meeting, 2008, p. 1.

* cited by examiner

*Primary Examiner* — Sheila V Clark
(74) *Attorney, Agent, or Firm* — Murphy, Bilak & Homiller, PLLC (57) ABSTRACT

A method of separating individual dies of a semiconductor wafer includes forming a metal layer on a first surface of a semiconductor wafer, the semiconductor wafer including a plurality of dies, separating the plurality of dies from one another, and electrical discharge machining the metal layer into individual segments each of which remains attached to one of the dies. A corresponding semiconductor die produced by such a method is also provided.

18 Claims, 13 Drawing Sheets

SINGULATION OF SEMICONDUCTOR DIES WITH CONTACT METALLIZATION BY ELECTRICAL DISCHARGE MACHINING

TECHNICAL FIELD

The present application relates to singulation of dies fabricated on a semiconductor wafer, in particular defect-free singulation of such dies.

BACKGROUND

Singulation (i.e. separation) of dies (chips) fabricated on a semiconductor wafer is conventionally performed by mechanical dicing (sawing), dry laser dicing, water-jet guided laser dicing, stealth dicing via pulsed laser or plasma dicing. In the case of thin dies with a thick backside metal layer needed for mechanical stabilization, the structuring of the backside metal stack composed of a variety of different metal layers such as Cu on the wafer is necessary prior to the separation of the semiconductor dies in order to avoid chipping and metal burr formation. This structuring of the thick backside metallization is typically done by pattern plating or wet etching, which are both limited to thin metal stabilization layers of approximately 20 µm to 40 µm thick. Wet chemical structuring of thick backside metal stacks with thicknesses of approximately 40 µm to 100 µm and larger is very expensive and results in lateral etching and hence non-perpendicular metal sidewalls. In the case of mechanical dicing, the sidewalls of the dies can be damaged with cracks which propagate during the sawing process.

In the case of laser-based dicing, the penetration depth of the laser radiation into the bulk semiconductor causes excessive heating of the underlying semiconductor dies. This excessive heating leads to chemical formation of metal-semiconductor compounds such as Cu-silicide on the sidewalls of the dies. The metal-semiconductor compound diffuses into the semiconductor bulk and degrades the electrical performance of the dies to be separated. The excessive heating resulting from laser-based dicing also causes localized melting of the backside metallization.

SUMMARY

According to an embodiment of a method of separating individual dies of a semiconductor wafer, the method comprises: forming a metal layer on a first surface of a semiconductor wafer, the semiconductor wafer including a plurality of dies; separating the plurality of dies from one another; and electrical discharge machining the metal layer into individual segments each of which remains attached to one of the dies. The metal layer can be electrical discharge machined into individual segments by positioning at least one electrode over a region of the metal layer between adjacent ones of the dies and applying high voltage, high frequency pulses to the at least one electrode and the metal layer sufficient to free metal ions from each region of the metal layer covered by the at least one electrode.

According to an embodiment of a semiconductor die, the die comprises a semiconductor substrate having a first surface, a second surface opposite the first surface, and sidewalls extending perpendicular between the first and second surfaces. The semiconductor die further comprises a metal layer covering the first surface of the semiconductor substrate. The metal layer has a first surface facing the first surface of the semiconductor substrate, a second surface opposite the first surface, and sidewalls extending perpendicular between the first and second surfaces. The sidewalls of the semiconductor substrate are devoid of metal-semiconductor compounds. The sidewalls of the metal layer are devoid of melted regions and burrs.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A through 1O, illustrates an embodiment of a method of separating individual dies of a semiconductor wafer by electrical discharge machining.

FIG. 2, which includes

FIG. 3, which includes

DETAILED DESCRIPTION

The embodiments described herein provide for structuring a metal layer disposed on a semiconductor wafer by electrical discharge machining, which involves removing metal by micro-sparking only in the region of the metal layer under the electrode used to implement the electrical discharge machining. The metal layer on the wafer can be realized by any standard metallization technique such as e.g. electrochemical deposition, PVD (physical vapor deposition), sputtering, etc. or by a attaching a metal foil to the semiconductor wafer by any standard attach techniques such as diffusion soldering, anodic bonding, glue attach, etc. prior to or after die singulation (i.e. separation).

Figure 1A:
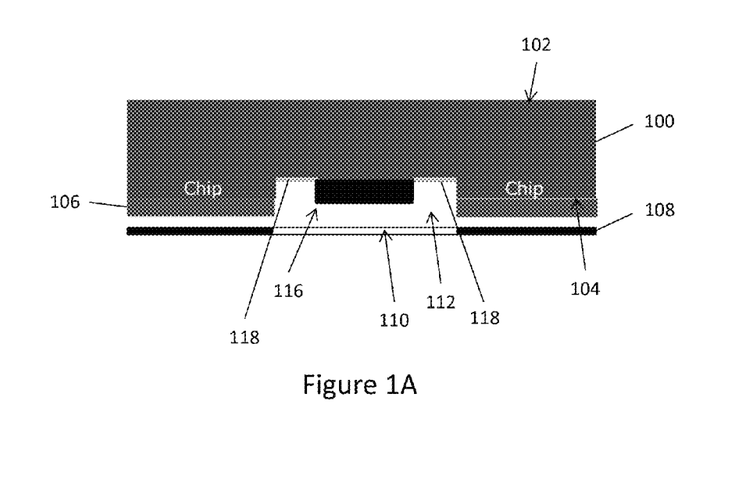

FIG. 1, which includes FIGS. 1A through 1O, illustrates an embodiment of a method of separating individual dies (chips) of a semiconductor wafer by electrical discharge machining (also commonly referred to as micro-sparking). FIGS. 1A through 1O show respective partial cross-sectional views of a semiconductor wafer at different stages of the method. FIGS. 1A through 1C illustrate purely optional steps for attaching a support substrate to the semiconductor wafer prior to the metal layer structuring. These optional steps are particularly useful for semiconductor wafers that are to be thinned e.g. to between 500 nm and 100 µm and/or for wafers that have kerf sites with test structures. The test structures in the kerf sites are used for process control and to predict the behavior of the dies, since the kerf sites are processed in the same environment and by the same methods as the dies.

In FIG. 1A, a second surface 104 of the semiconductor wafer 100 is coated by a positive resist 106. The positive resist 106 is exposed using a photolithographic mask 108 with openings 110 and then developed to form a mask with openings 112 that expose test structures 114 of kerf sites 116 at the second surface 104 of the semiconductor wafer 100. Alternatively, a negative resist could be used and exposed using a photolithographic mask with reversed polarity.

Figure 1B:
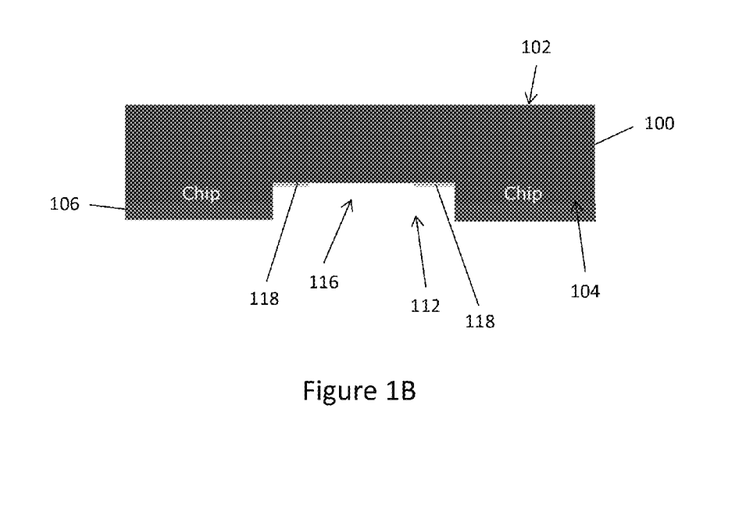

In FIG. 1B, the test structures 114 of the kerf sites 116 are removed e.g. by wet etching. In the case of copper-based test structures 114, this can involve AlSiCu metal wet etching.

Figure 1C:
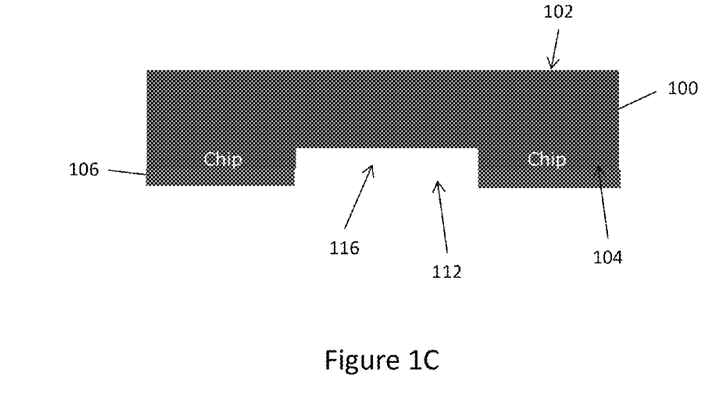

In FIG. 1C, any residual oxide 118 in the kerf sites 116 can be removed e.g. also by wet etching.

Figure 1D:
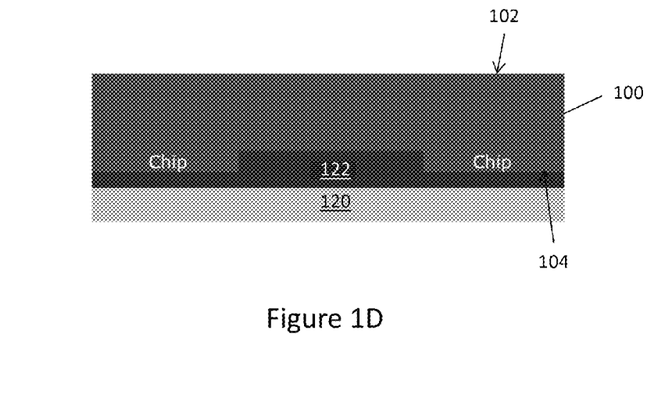

In FIG. 1D, the resist 106 is removed e.g. using NMP (1-methyl-2-pyrrolidon) and a support substrate 120 such as an adhesive film, glass carrier, ceramic, etc. is attached to the second surface 104 of the semiconductor wafer 100 e.g. by an adhesive 122. An opposite first surface 102 of the semiconductor wafer 100 can be thinned e.g. to 40 μm or thinner if desired to yield thinner dies (chips). The first surface 102 of the wafer 100 corresponds to the backside of the dies according to this embodiment.

In FIGS. 1A through 1D, only a part of the semiconductor wafer 100 between two adjacent dies is shown for ease of illustration. The wafer 100 can include many dies as is standard practice in the semiconductor industry.

Figure 1E:
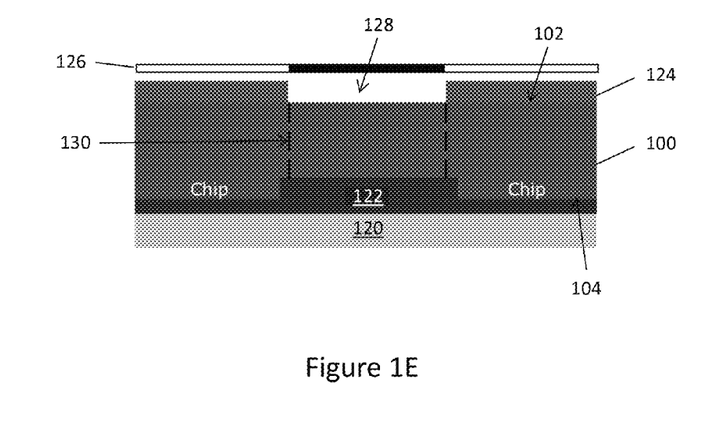

In FIG. 1E, the first surface 102 of the semiconductor wafer 100 is coated with a negative resist 124. A mask 126 such as a Cr mask is positioned over the resist 124 and used to expose and develop the resist 124 to form a mask with openings 128 that expose dicing or sawing streets 130 between adjacent ones of the dies. Alternatively a positive resist could be used and exposed using a photolithographic mask with reversed polarity. The dicing/sawing streets 130 are regions of the semiconductor wafer 100 devoid of any devices pertaining to the individual dies, and represent regions of the wafer 100 to be singulated e.g. by sawing, laser ablation, etching, etc. in order to separate the individual dies.

Figure 1F:
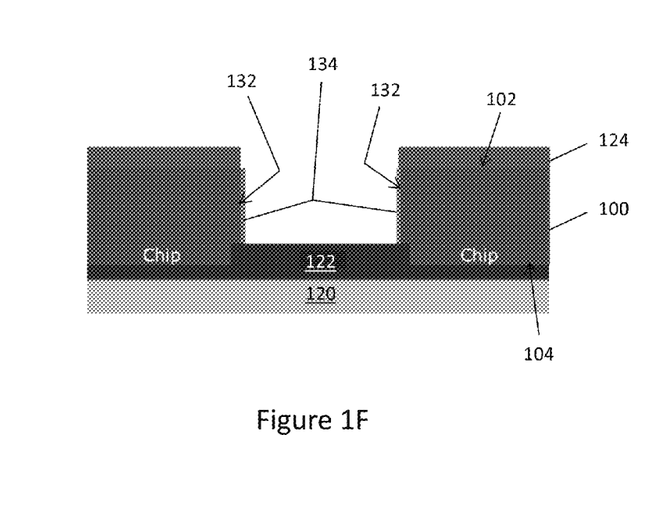

In FIG. 1F, the individual dies have been singulated along the dicing/sawing streets 130. Any standard die singulation process can be used to separate the individual dies. For example, the singulation process can be carried out in discrete etching steps followed by polymer deposition on the sidewalls 132 of the dies. The etching process can stop on the adhesive 122 or other material used to attach the semiconductor wafer 100 to the support substrate (if provided) 120. The discrete application of a polymer 134 to the sidewalls 132 of the dies protects the die sidewalls 132 during the subsequent etching steps.

Figure 1G:
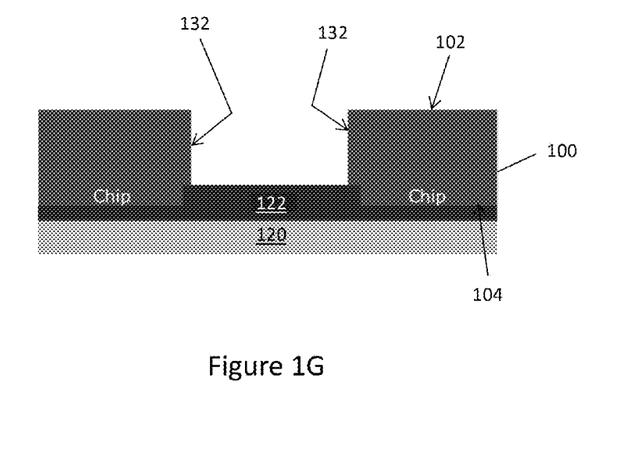

In FIG. 1G, the resist 124 and the polymer 134 on the sidewalls 132 of the dies have been removed by any suitable standard process such as etching.

Figure 1H:
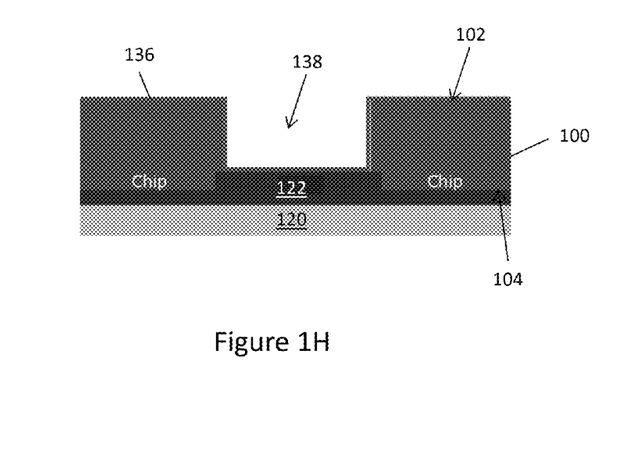

In FIG. 1H, a metallization attach material 136 such as an adhesive, solder, an advanced diffusion soldering material like AuSn, etc. is provided on the first surface 102 of the semiconductor wafer 100. In the case of an advanced diffusion soldering material, the metallization attach material 136 can be deposited by sputtering in a plasma environment into the singulation trenches 138 between adjacent ones of the dies.

Figure 1I:
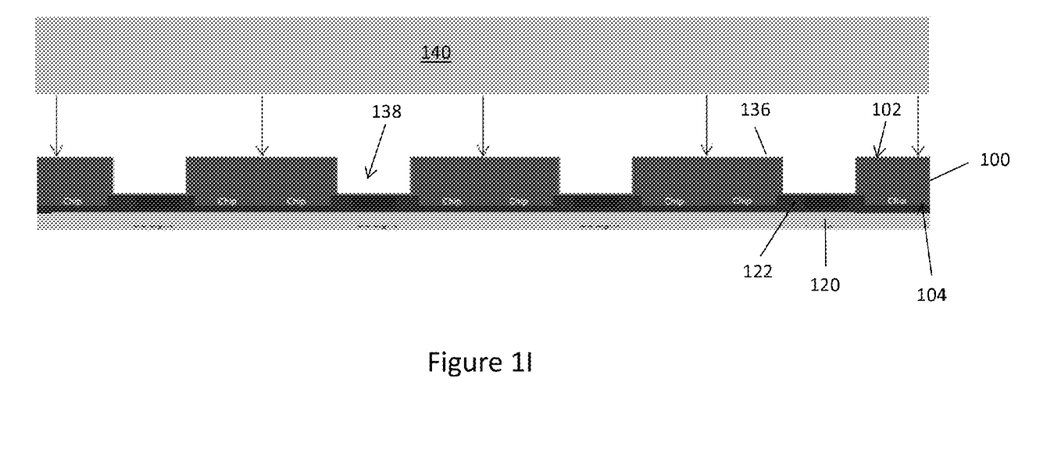

In FIG. 1I, a metal layer 140 such as a metal foil is attached to the first surface 102 of the semiconductor wafer 100 by the metallization attach material 136 as indicated by the downward facing arrows in FIG. 1I. The metal layer 140 can comprise any standard metallization such as Cu, Mo, W, etc. or alloys thereof. Still other types of metal layers can be used. In general, the metal layer 140 is a covering piece of metal material that lies over at least part of the semiconductor wafer 100. In the case of Cu material systems, the metal layer 140 can be attached to the first surface 102 of the semiconductor wafer 100 in a vacuum oven with formic acid pre-cleaning.

Figure 1J:
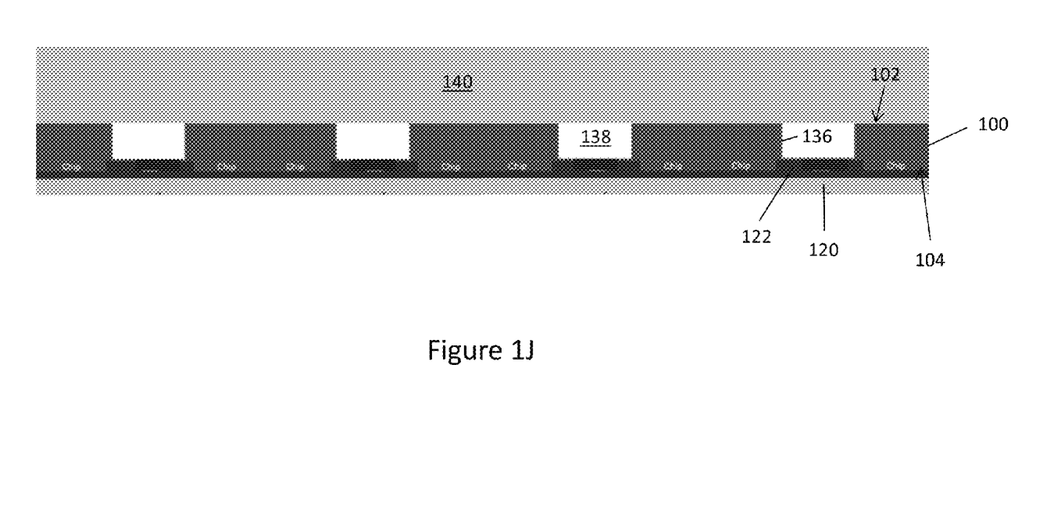

FIG. 1J shows the case of the metal layer 140 attached to the first surface 102 of the semiconductor wafer 100 by advanced diffusion soldering. In this case, a thin metal layer (e.g. 1-10 μm thick) inter-diffuses with the metal layer 140 during a thermal process to yield an intermetallic compound layer with a re-melting temperature higher than the bonding temperature. CuSn and AuSn are common advanced diffusion soldering systems. Other advanced diffusion soldering systems may be used.

Figure 1K:
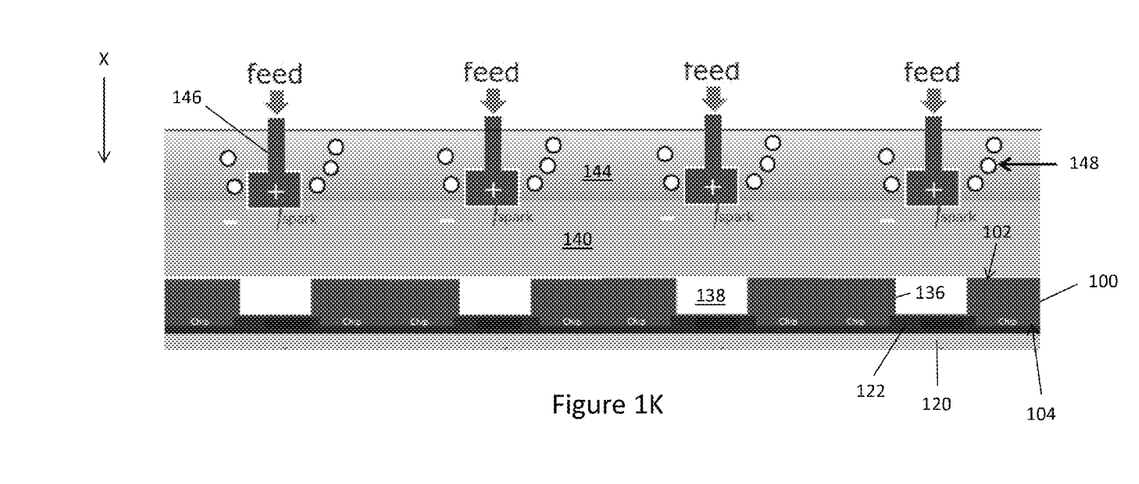
Figure 1L:
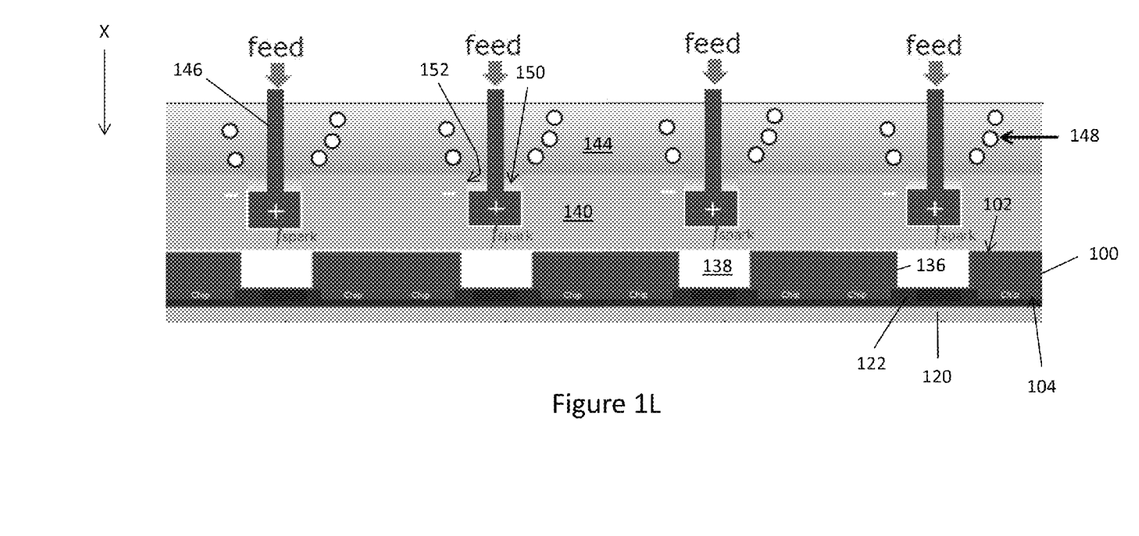
Figure 1M:
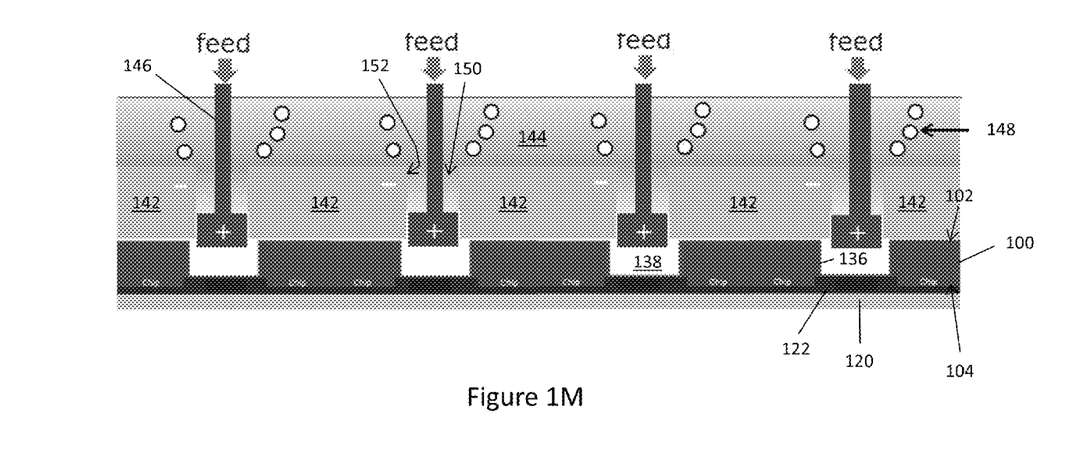

FIGS. 1K through 1M illustrate the process of electrical discharge machining the metal layer 140 into individual segments 142 each of which remains attached to one of the dies. In FIG. 1K, the metal layer 140 is immersed in a dielectric liquid 144 such as e.g. deionized water or a liquid containing hydrocarbons like e.g. kerosene. In some cases, the dielectric liquid 144 can be omitted. At least one electrode 146 is positioned over a region of the metal layer 140 between adjacent ones of the dies. In FIG. 1K, an array of electrodes 146 is positioned over each region of the metal layer 140 to be cut by micro-sparking. Alternatively, a single electrode 146 shaped to cover all regions of the metal layer 140 to be electrical discharge machined can be positioned over the wafer 100.

In either case, high voltage, high frequency pulses are applied to each electrode 146 and the metal layer 140. The voltage and frequency of the pulses are sufficient to free metal ions 148 from each region of the metal layer 140 covered by an electrode 146. In one embodiment, the high voltage, high frequency pulses applied to each electrode 146 range between 1 mV and several kV and between $10^3$ Hz to $10^6$ Hz to cut through the metal layer 140 by micro-sparking.

Also in FIG. 1K, the electrodes 146 form the anode (+) for the electrical discharge machining process and the metal layer 140 forms the cathode (−). Sparking generated by the high voltage, high frequency pulses causes small erosion craters to form in the metal layer 140, with the freed metal ions 148 being removed by the dielectric liquid 144. Each electrode 146 is moved in a vertical direction (X) in the dielectric liquid 144 toward the first surface 102 of the semiconductor wafer 100 as the metal ions 148 are removed by the dielectric liquid 144 and dissolved. The vertical electrode movement is indicated by the downward facing arrows labeled 'feed' in FIG. 1K. In one embodiment, each electrode 146 moves toward the first surface 102 of the semiconductor wafer 100 at a constant feed speed which can be determined as a function of the micro-sparking voltage and frequency and the type of metal layer 140 being be electrical discharge machined.

FIG. 1L shows the semiconductor wafer 100 as the electrical discharge machining process continues, with the electrodes 146 moving closer to the first surface 102 of the semiconductor wafer 100 as additional metal ions 148 continue to be freed from the metal layer 140 and removed by the dielectric liquid 144. By applying a constant feed speed, the electrodes 146 move into the metal layer 140 and spark out metal ions and create deep trenches 150 in the metal layer 140 with smooth metal sidewalls 152.

In FIG. 1M, the electrical discharge machining process stops when the electrodes 146 reach the previously created gap 138 between adjacent ones of the singulated (separated) dies. The micro-sparking stops once all metal directly under the electrodes 146 is removed.

Figure 1N:
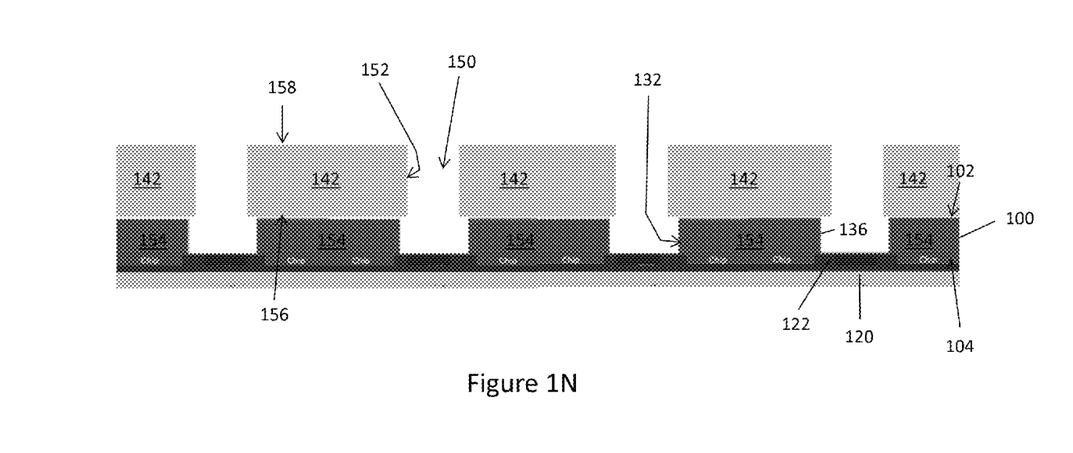

FIG. 1N shows the semiconductor wafer 100 after the electrical discharge machining process has completed. Each semiconductor die has a semiconductor substrate 154 with a first surface 102, a second surface 104 opposite the first surface 102, and sidewalls 132 extending perpendicular between the first and second surfaces 102, 104. A segment 142 of the metal layer 140 covers the first surface 102 of each individual semiconductor substrate 154, and was previously segmented by the electrical discharge machining process. Each metal segment 142 has a first surface 156 facing the first surface 102 of the corresponding semiconductor substrate 154, a second surface 158 opposite the first surface 156, and sidewalls 152 extending perpendicular between the first and second surfaces 156, 158. The sidewalls 132 of each semiconductor substrate 154 are devoid of metal-semiconductor compounds. The sidewalls 152 of each metal segment 142 realized by the electrical discharge machining process are devoid of melted regions and burrs.

FIG. 1O shows the post-electrical discharged machined semiconductor wafer after lamination and mounting of the structure to a frame 160 e.g. by an adhesive. The support substrate (if provided) 120 at the opposite side of the structure can be removed as indicated by the downward facing arrows shown in FIG. 1O.

FIG. 2, which includes FIGS. 2A through 2H, illustrates another embodiment of a method of separating individual dies (chips) of a semiconductor wafer 100 by electrical discharge machining. FIGS. 2A through 2H show respective partial cross-sectional views of a semiconductor wafer 100 at different stages of the method. The embodiment shown in FIG. 2 is similar to the embodiment shown in FIG. 1, however, the dies are separated from one another after the metal layer 140 is electrical discharge machined into the individual segments 142.

Figure 2A:
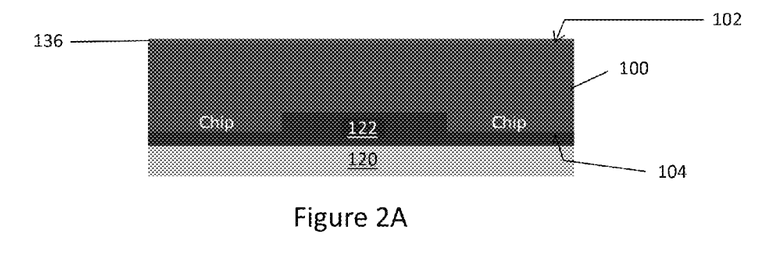
FIGS. 2A through 2H, illustrates another embodiment of a method of separating individual dies of a semiconductor wafer by electrical discharge machining.

In FIG. 2A, the semiconductor wafer 100 is attached to a support substrate 120 e.g. after removal of kerf test structures if provided. Any standard support substrate 120 can be used such as an adhesive film, glass carrier, ceramic, etc. and attached to the second surface 104 of the semiconductor wafer 100 e.g. by an adhesive 122. The opposite first surface 102 of the semiconductor wafer 100 can be thinned e.g. to 40 μm or thinner if desired to yield thinner dies. The first surface 102 of the wafer 100 corresponds to the backside of the dies according to this embodiment. In FIG. 1A, only a part of the semiconductor wafer 100 between two adjacent dies is shown for ease of illustration. The wafer 100 can include many dies as is standard practice in the semiconductor industry.

Figure 2B:
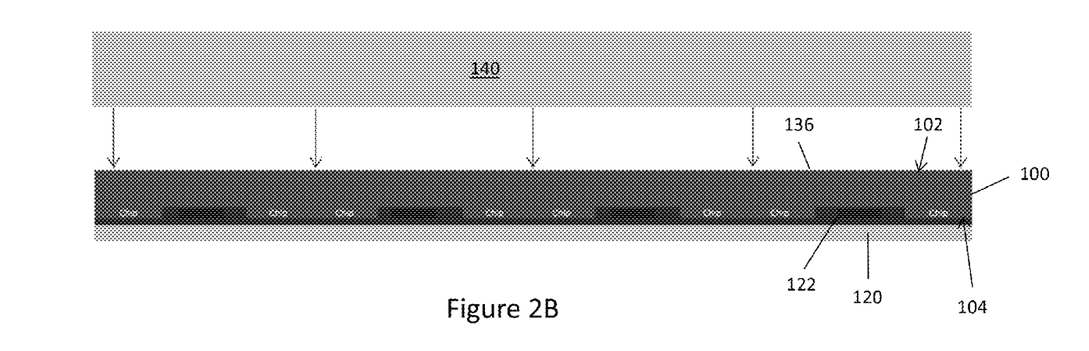

In FIG. 2B, a metallization attach material 136 such as an adhesive, solder, an advanced diffusion soldering material like AuSn, etc. is provided on the first surface 102 of the semiconductor wafer 100. A metal layer 140 such as a metal foil is attached to the first surface 102 of the semiconductor wafer 100 by the metallization attach material 136 as indicated by the downward facing arrows in FIG. 2B. The metal layer 140 can comprise any standard metallization such as Cu, Mo, W, etc. or alloys thereof. Still other types of metal layers can be used. In general, the metal layer 140 is a covering piece of metal material that lies over at least part of the semiconductor wafer 100. In the case of Cu material systems, the metal layer 140 can be attached to the first surface 102 of the semiconductor wafer 100 in a vacuum oven with formic acid pre-cleaning.

Figure 2C:
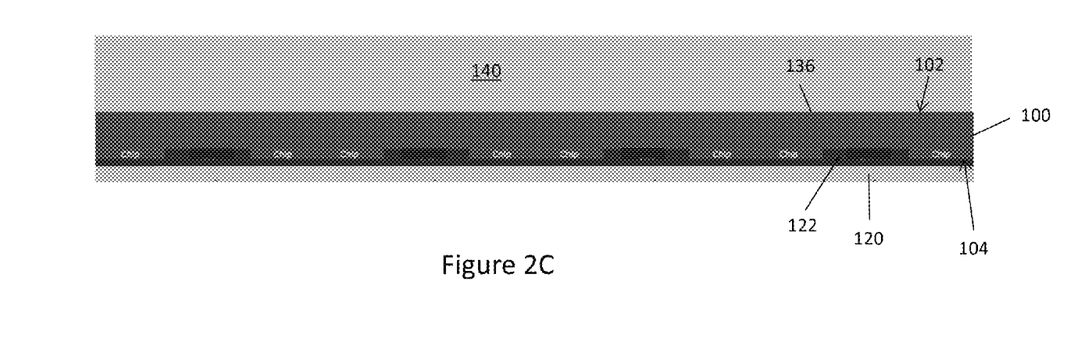

FIG. 2C shows the case of the metal layer 140 attached to the first surface 102 of the semiconductor wafer 100 by advanced diffusion soldering. In this case, a thin metal layer (e.g. 1-10 μm thick) inter-diffuses with the metal layer 140 to yield an intermetallic compound layer as previously described herein.

Figure 2D:
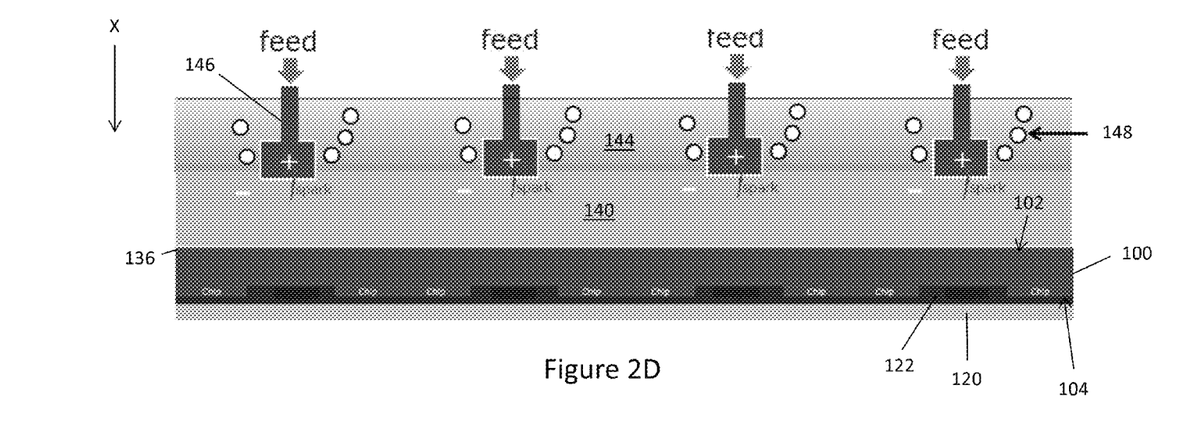
Figure 2E:
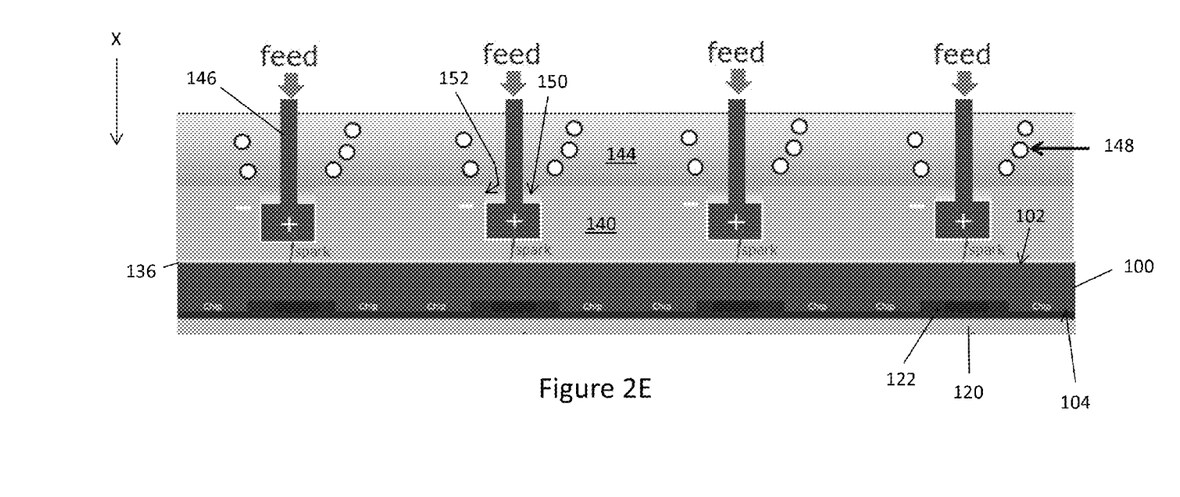
Figure 2F:
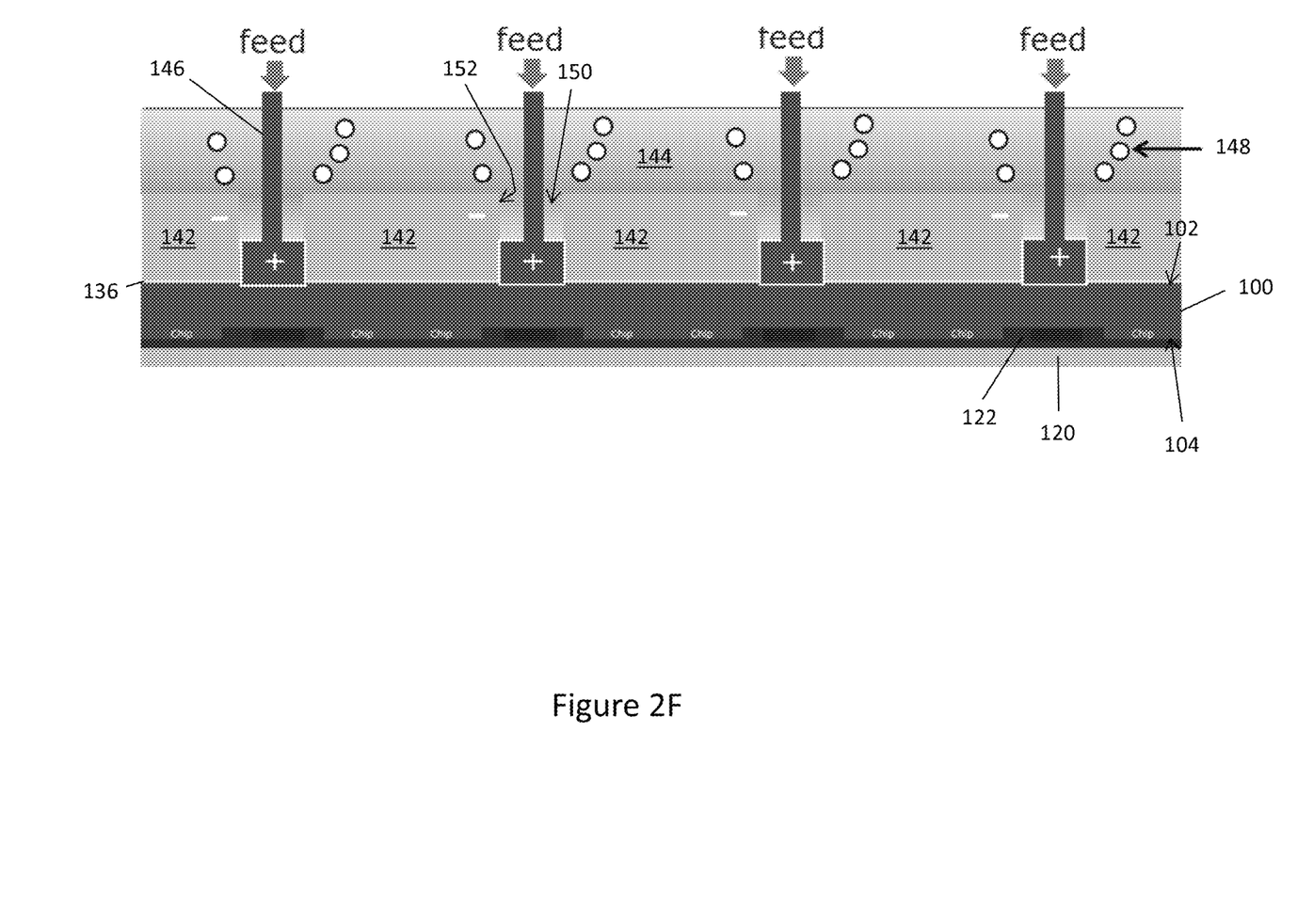

FIGS. 2D through 2F illustrate the process of electrical discharge machining the metal layer 140 into individual segments 142 each of which remains attached to one of the dies. In FIG. 2D, the metal layer 140 is immersed in a dielectric liquid 144 such as e.g. deionized water or a liquid containing hydrocarbons like e.g. kerosene. In some cases, the dielectric liquid can be omitted. At least one electrode 146 is positioned over a region of the metal layer 140 between adjacent ones of the dies. In FIG. 2D, an array of electrodes 146 is positioned over each region of the metal layer 140 to be cut by micro-sparking. Alternatively, a single electrode 146 shaped to cover all regions of the metal layer 140 to be electrical discharge machined can be positioned over the wafer 100.

In either case, high voltage, high frequency pulses are applied to each electrode 146 and the metal layer 140. The voltage and frequency of the pulses are sufficient to free metal ions 148 from each region of the metal layer 140 covered by an electrode 146 as previously described herein.

Also in FIG. 2D, the electrodes 146 form the anode (+) for the electrical discharge machining process and the metal layer 140 forms the cathode (−). Micro-sparking generated by the high voltage, high frequency pulses causes small erosion craters to form in the metal layer 140, with the metal ions 148 being removed by the dielectric liquid 144 and dissolved. Each electrode 146 is moved in a vertical direction (V) in the dielectric liquid 144 toward the first surface 102 of the semiconductor wafer 100 as the metal ions 148 are removed by the dielectric liquid 144. The vertical electrode movement is indicated by the downward facing arrows labeled 'feed' in FIG. 2D. Each electrode 146 can move toward the first surface 102 of the semiconductor wafer 100 at a constant feed speed as previously described herein.

FIG. 2E shows the semiconductor wafer 100 as the electrical discharge machining process continues, with the electrodes 146 moving closer to the first surface 102 of the semiconductor wafer 100 as additional metal ions 148 are freed from the metal layer 140 and removed by the dielectric liquid 144, forming deep trenches 150 in the metal layer 140 with smooth metal sidewalls 152.

In FIG. 2F, the electrical discharge machining process stops when the electrodes 146 reach the first surface 102 of the semiconductor wafer 100. The micro-sparking stops once all metal directly under the electrodes 146 is removed, including the advanced diffusion soldering layer 136 if provided.

Figure 2G:
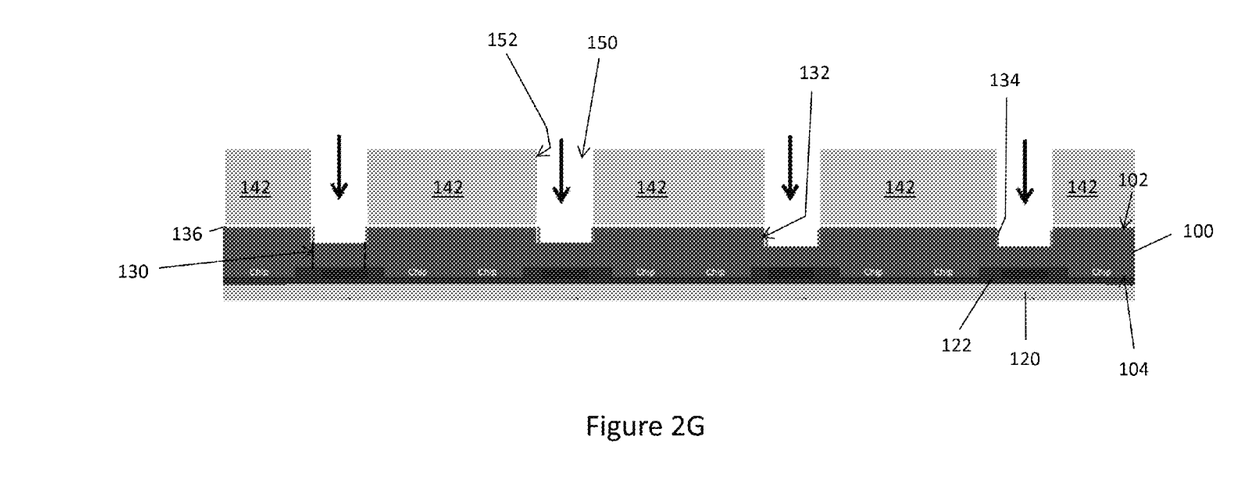

In FIG. 2G, the individual dies are singulated along dicing/sawing streets 130. The singulation process is indicated by downward facing arrows in FIG. 2G. The metal layer 140 is not cut during this process since the metal layer 140 was previously segmented by the electrical discharge machining process shown in FIGS. 2D through 2F. Any standard die singulation process can be used to separate the individual dies such as mechanical dicing, dry laser dicing, water-jet guided laser dicing, stealth dicing, plasma dicing, etc. For example, the singulation process can be carried out in discrete etching steps followed by deposition of a polymer 134 on the sidewalls 132 of the dies. FIG. 2G shows the structure after one of the discrete etching/polymer deposition steps.

Figure 2H:
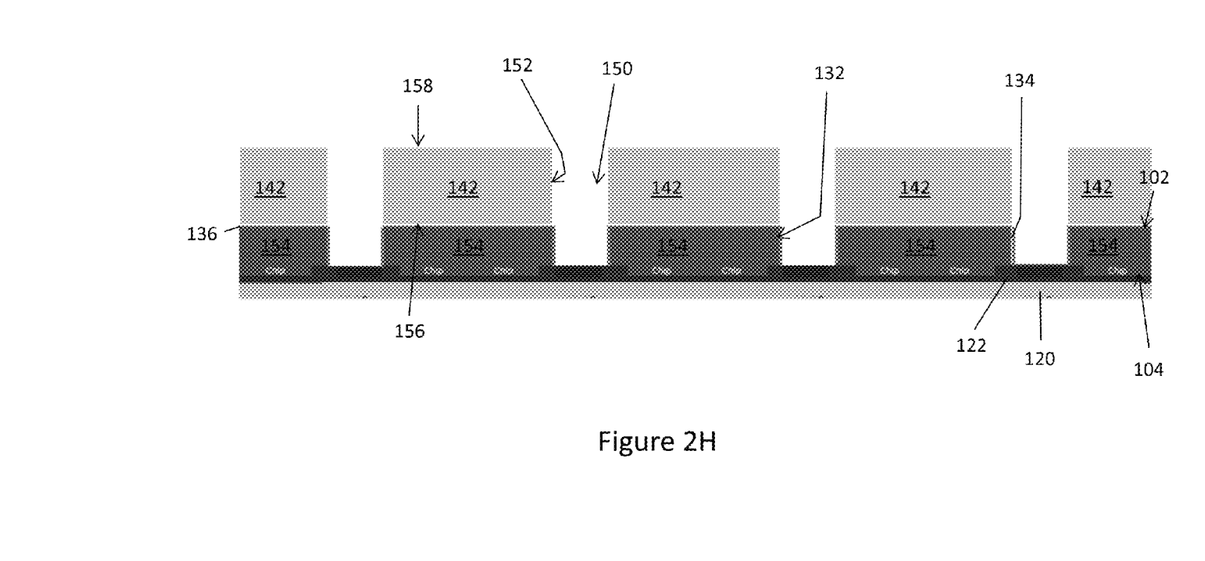

In FIG. 2H, the etching process stops on the adhesive 122 or other material used to attach the semiconductor wafer 100 to the support substrate (if provided) 120. The discrete application of the polymer 134 to the sidewalls 132 of the dies protects the die sidewalls 132 during the subsequent etching steps. The polymer 134 on the sidewalls 132 of the dies can then be removed by any suitable standard process such as etching, and subsequent standard processing performed such as mounting of the final structure to a frame and removal of the support substrate (if provided) 120 e.g. as shown in FIG. 1O. Each resulting semiconductor die has a semiconductor substrate 154 with a first surface 102, a second surface 104 opposite the first surface 102, and sidewalls 132 extending perpendicular between the first and second surfaces 102, 104. A segment 142 of the metal layer 140 covers the first surface 102 of each individual semiconductor substrate 154, and was previously segmented by the electrical discharge machining process. Each metal segment 142 has a first surface 156 facing the first surface 102 of the corresponding semiconductor substrate 154, a second surface 158 opposite the first surface 156, and sidewalls 152 extending perpendicular between the first and second surfaces 158. The sidewalls 132 of each semiconductor substrate 154 are devoid of metal-semiconductor compounds. The sidewalls 152 of each metal segment 142 realized by the electrical discharge machining process are devoid of melted regions and burrs.

The electrical discharge machining process described herein is highly selective to metal (typically about 50 to 100 more times more selective on metal as compared to semiconductor materials such as Si, GaN, GaAs, etc.), and automatically stops after the metal layer 140 is completely segmented in the desired regions 142. Metal is not evaporated as part of the electrical discharge machining process, but rather metal ions 148 are freed from the metal layer 140 in the desired regions by micro-sparking and dissolved in the dielectric liquid 144. As such, the sidewalls 132 of the dies are devoid of metal-semiconductor compounds such as Cu-Silicide. Also, the sidewalls 152 of the trenches 150 formed in the metal layer 140 are devoid of melted regions and burrs by using electrical discharge machining because the electrical discharge machining process does not cause excessive localized heating of the metal sidewalls 152.

The electrical discharge machining process described herein allows for patterning of very thick backside metals (e.g. 20 μm to 200 μm or even thicker). The electrical discharge machining process described herein can also be used for structuring thick metal layers on the frontside of semiconductor dies. That is, the metal layer 140 shown in FIGS. 1 and 2 can be on the backside or frontside of the dies. In addition, the methods of FIGS. 1 and 2 can include forming an additional metal layer on the opposite surface of the semiconductor wafer 100 as the original metal layer 140. Both (opposing) metal layers can be electrical discharge machined into individual segments each of which remains attached to one of the dies. This way, each die has a thick metal layer on both opposing main surfaces of the die that was processed by electrical discharge machining.

Patterning of semiconductor substrates in-situ (one equipment, one process step) is also possible with the electrical discharge machining process described herein. Each electrical discharge machining electrode 146 can be properly aligned with a corresponding kerf site 116 using any standard front-side or back-side alignment techniques such as optical inspection with cameras, backside inspection in the case of a glass support substrate 120, etc. The electrical discharge machining process described herein can be adapted to any dicing process and any metal layer stacks deposited on a wafer backside or frontside. As a result, thick metal layers processed by the electrical discharge machining methods described herein have uniform properties post-processing such as uniform hardness, uniform crystallographic orientation of the metal grains, uniform elastic modulus, etc. By adjusting the micro-sparking parameters such as electrode voltage and/or frequency, cutting by micro-sparking can also be done through the semiconductor material (e.g. Si, SiC, GaN, GaAs, etc.) in order to separate the semiconductor dies.

The width of the trenches 150 formed in the metal layer 140 by the electrical discharge machining process described herein is determined by the electrode dimensions, and can be adjusted by using different electrode geometrical shapes and sizes. For example, a wider electrode 146 yields a corresponding wider trench 150 through the metal layer 140. Conversely, a narrower electrode 146 yields a narrower trench 150 through the metal layer 140. The angle and contour of the trench sidewalls 152 are also determined by the electrode dimensions. The sidewalls of the electrode 146 can extend generally perpendicular with respect to the first surface 102 of the semiconductor wafer 100, yielding generally perpendicular trench sidewalls 152 in the metal layer 140. The term 'perpendicular' as used herein with regard to the shape of the electrode 146 and trench sidewalls 152 refers to a direction perpendicular to the first surface 102 of the semiconductor wafer 100. Alternatively, the electrode sidewalls can be angled to yield correspondingly angled trench sidewalls 152 in the metal layer 140.

Figure 3A:
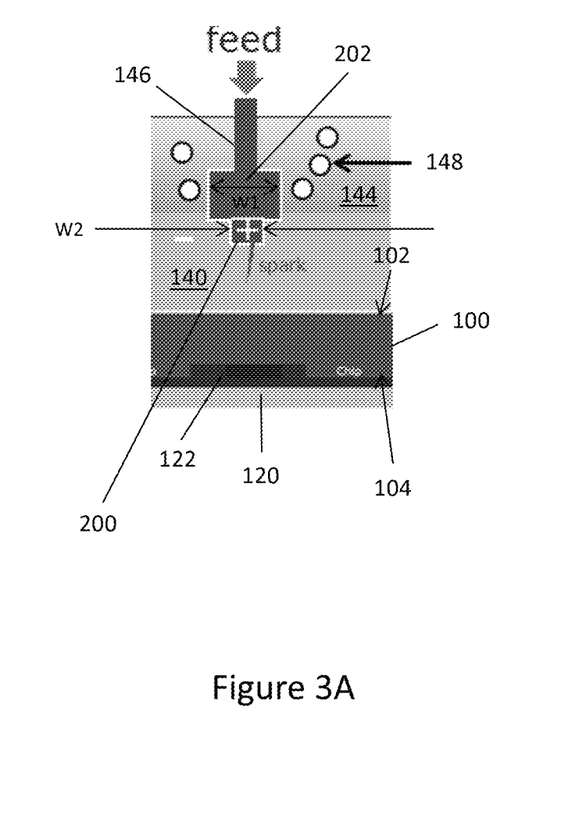
FIGS. 3A and 3B, illustrates yet another embodiment of a method of separating individual dies of a semiconductor wafer by electrical discharge machining.
Figure 3B:
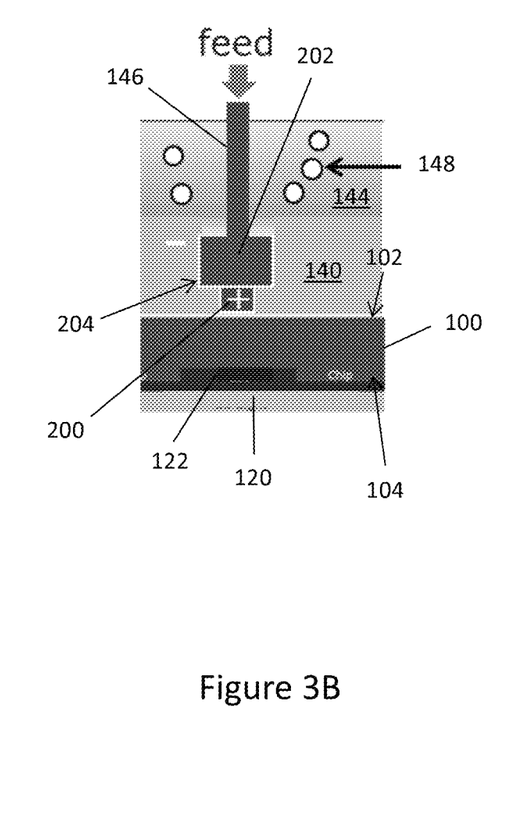

FIGS. 3A and 3B illustrate an embodiment of electrical discharge machining a metal layer 140 that covers at least part of a semiconductor wafer 100 into individual segments. According to this embodiment, at least one electrical discharge machining electrode 146 has a narrower (W1) first part 200 disposed closest to the metal layer 140 to be segmented and a wider (W2) second part 202 disposed further from the metal layer 140 than the first electrode part 200. This way, a step 204 is formed in the metal layer 140 as the electrode 146 moves closer to the first surface 102 of the semiconductor wafer 100 as shown in the transition from FIG. 3A to FIG. 3B. The step 204 corresponds to the width difference between the first and second parts 200, 202 of the electrode 146. The electrode 146 can have other shapes and dimensions, depending on the trench profile to be formed in the metal layer 140.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of separating individual dies of a semiconductor wafer, the method comprising:
    forming a metal layer on a first surface of a semiconductor wafer, the semiconductor wafer including a plurality of dies;
    separating the plurality of dies from one another; and
    electrical discharge machining the metal layer into individual segments each of which remains attached to one of the dies,
    wherein electrical discharge machining the metal layer into individual segments comprises:
        positioning at least one electrode over a region of the metal layer between adjacent ones of the dies; and
        applying high voltage, high frequency pulses to the at least one electrode and the metal layer sufficient to free metal ions from each region of the metal layer covered by the at least one electrode.

2. The method of claim 1, further comprising:
    immersing the metal layer in a dielectric liquid; and
    moving the at least one electrode in a vertical direction in the dielectric liquid toward the first surface of the semiconductor wafer as the metal ions are removed by the dielectric liquid.

3. The method of claim 2, wherein the at least one electrode is moved toward the first surface of the semiconductor wafer at a constant feed speed.

4. The method of claim 2, wherein the dies are separated from one another after the metal layer is electrical discharge machined into the individual segments, and wherein the electrical discharge machining stops when the at least one electrode reaches the first surface of the semiconductor wafer.

5. The method of claim 2, wherein the dies are separated from one another before the metal layer is electrical discharge machined into the individual segments, and wherein the electrical discharge machining stops when the at least one electrode reaches a gap between adjacent ones of the dies.

6. The method of claim 2, wherein the dielectric liquid comprises hydrocarbons or deionized water.

7. The method of claim 1, wherein the semiconductor wafer includes kerf test sites comprising test structures between adjacent ones of the dies at a second surface of the semiconductor wafer opposite the first surface, the method further comprising:
    aligning the at least one electrode with the kerf test sites so that metal ions are freed from each region of the metal layer aligned with the kerf test sites.

8. The method of claim 7, further comprising:
    removing the test structures from the kerf test sites; and
    mounting the semiconductor wafer to a support substrate at the second surface of the semiconductor wafer after the test structures are removed and before the electrical discharge machining of the metal layer.

9. The method of claim 1, wherein positioning at least one electrode over a region of the metal layer between adjacent ones of the dies comprises positioning an array of electrodes over each region of the metal layer between adjacent ones of the dies.

10. The method of claim 1, wherein the high voltage, high frequency pulses applied to the at least one electrode range between 1 mV and several kV and between $10^3$ Hz to $10^6$ Hz.

11. The method of claim 1, wherein the at least one electrode comprises a narrower first part disposed closest to the metal layer and a wider second part disposed further from the metal layer than the first part so that a step is formed in the metal layer as the at least one electrode moves toward the first surface of the semiconductor wafer, the step corresponding to the transition between the first and second parts of the at least one electrode.

12. The method of claim 1, further comprising:
    forming an additional metal layer on a second surface of the semiconductor wafer opposite the first surface; and
    electrical discharge machining the additional metal layer into individual segments each of which remains attached to one of the dies.

13. The method of claim 1, wherein the metal layer is between 20 μm and 200 μm thick.

14. The method of claim 1, wherein the dies are separated from one another after the metal layer is electrical discharge machined into the individual segments.

15. The method of claim 1, wherein the dies are separated from one another before the metal layer is electrical discharge machined into the individual segments.

16. The method of claim 15, wherein the metal layer is a metal foil adhered or diffusion soldered to the first surface of the semiconductor wafer.

17. A method of separating individual dies of a semiconductor wafer, the method comprising:
    forming a metal layer on a first surface of a semiconductor wafer, the semiconductor wafer including a plurality of dies;
    separating the plurality of dies from one another;
    electrical discharge machining the metal layer into individual segments each of which remains attached to one of the dies;
    forming an additional metal layer on a second surface of the semiconductor wafer opposite the first surface; and
    electrical discharge machining the additional metal layer into individual segments each of which remains attached to one of the dies.

18. A method of separating individual dies of a semiconductor wafer, the method comprising:
    forming a metal layer on a first surface of a semiconductor wafer, the semiconductor wafer including a plurality of dies;
    separating the plurality of dies from one another; and
    electrical discharge machining the metal layer into individual segments each of which remains attached to one of the dies,
    wherein the dies are separated from one another after the metal layer is electrical discharge machined into the individual segments.

* * * * *

UNITED STATES PATENT AND TRADEMARK OFFICE
CERTIFICATE OF CORRECTION

| | | |
|---|---|---|
| PATENT NO. | : 9,449,876 B2 | Page 1 of 1 |
| APPLICATION NO. | : 14/158398 | |
| DATED | : September 20, 2016 | |
| INVENTOR(S) | : M. Roesner et al. | |

It is certified that error appears in the above-identified patent and that said Letters Patent is hereby corrected as shown below:

On the Title Page
Other Publications, page 1, Column 2, Line 2, please change "Ti-Gal-4v" to -- Ti-6al-4v --

Signed and Sealed this
Seventh Day of February, 2017

Michelle K. Lee
*Director of the United States Patent and Trademark Office*